United States Patent [19]

Hill

[11] Patent Number: 4,600,138

[45] Date of Patent: Jul. 15, 1986

[54] BONDING TOOL AND CLAMP ASSEMBLY AND WIRE HANDLING METHOD

[75] Inventor: William H. Hill, Rancho Santa Fe, Calif.

[73] Assignee: Hughes Aircraft Company, Los Angeles, Calif.

[21] Appl. No.: 634,237

[22] Filed: Jul. 25, 1984

[51] Int. Cl.⁴ .............................................. B23K 31/02
[52] U.S. Cl. ..................................... 228/179; 228/4.5
[58] Field of Search .................. 228/179, 4.5; 225/83; 226/91

[56] References Cited

U.S. PATENT DOCUMENTS 4,068,371  1/1978  Miller .................................. 228/179
4,205,773  6/1980  Nicklaus .............................. 228/4.5

*Primary Examiner*—Nicholas P. Godici
*Assistant Examiner*—Karen Skillman
*Attorney, Agent, or Firm*—Joseph E. Szabo; Anthony W. Karambelas

[57] ABSTRACT

A bonding tool and clamp assembly is disclosed and includes an upper wire guide (23,51) and a bonding tool (17,75) having a short guide hole (45) adjacent the heel of the bonding tool foot (41). The bonding tool tip (17a) includes a clamping surface (47) adjacent the guide hole (45); and a clamp (21b,49b) is selectively forced toward the clamping surface (47) to clamp the bonding wire (39,77). The clamp (21b,49b) is biased toward the clamping surface by a spring (37,73), and is released from the clamping surface by an electromagnet (29,57).

10 Claims, 9 Drawing Figures

U.S. Patent   Jul. 15, 1986   Sheet 1 of 2   4,600,138
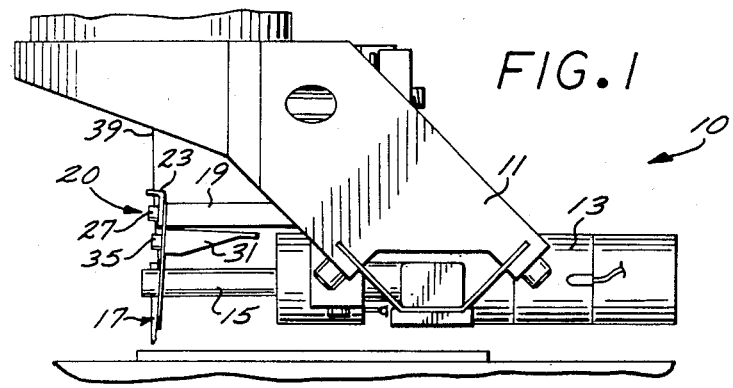
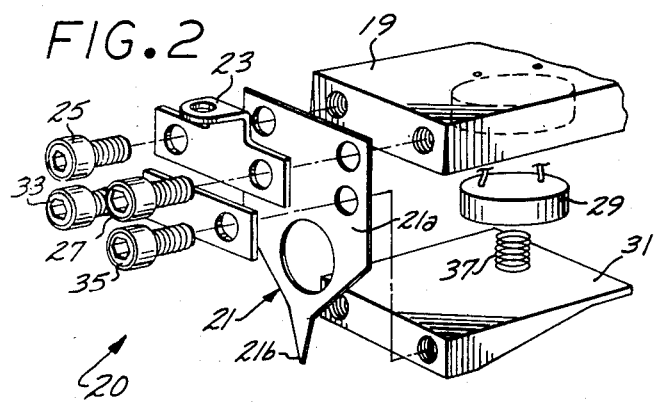
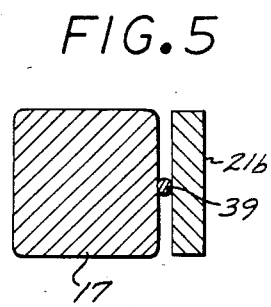
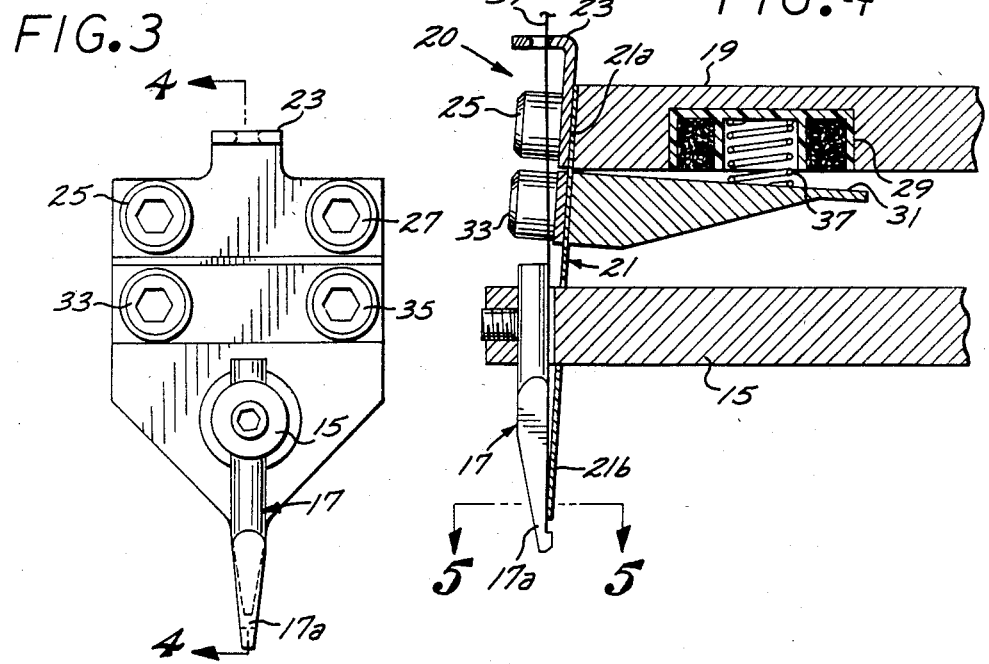

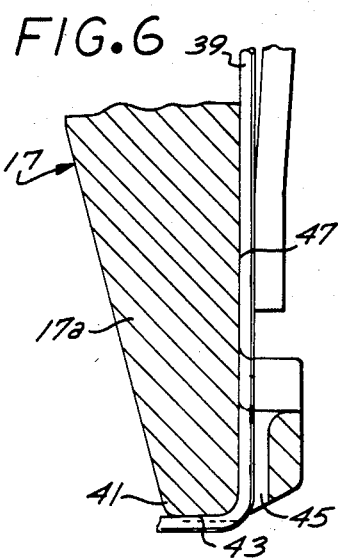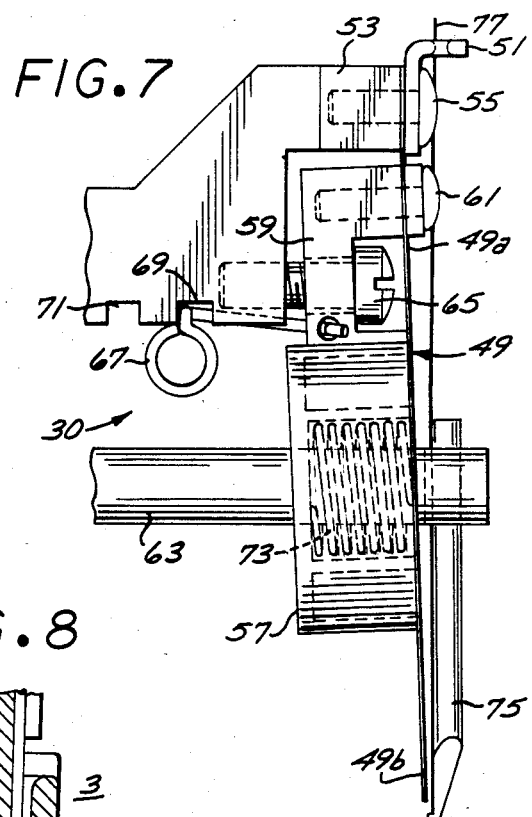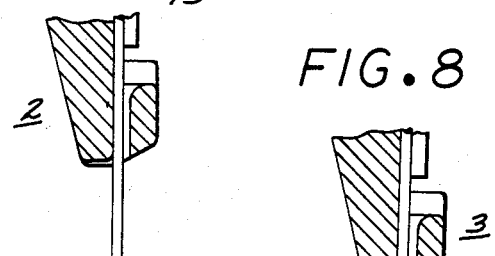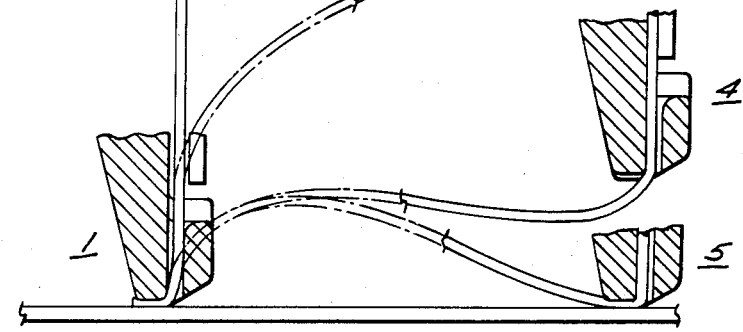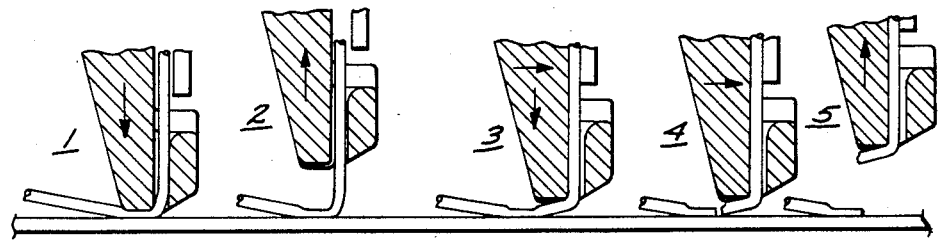

BONDING TOOL AND CLAMP ASSEMBLY AND WIRE HANDLING METHOD

BACKGROUND OF THE INVENTION

1. Field of the Invention

The disclosed invention generally relates to bonding thin wire leads in microelectronic circuits, and is particularly directed to a bonding tool and wire clamp assembly for wire bonding apparatus and to a method for wire handling.

2. Background Art

In the manufacture of microelectronic circuit packages, certain electrical connections are made with extremely thin gold or aluminum wires. For example, connections between a semiconductor integrated circuit chip and the package leads are typically made with such thin wires. As another example, active elements in semiconductor hybrid circuits may be interconnected with extremely thin wire.

The attachment of interconnecting thin wires is typically accomplished with wire bonding machines which supply wire and make the connections of the opposite ends of the wire leads. Generally, a wire bonding machine includes a bonding head which can move vertically, horizontally and rotatably about a vertical axis. A transducer (e.g., an ultrasonic transducer) is pivotally mounted to the bonding head so as to pivot about a horizontal axis, preferably at the center of gravity of the transducer and its mount. The transducer includes an arm portion with a bonding tool at its end. The bonding tool is raised and lowered relative to the workpiece by vertical movement of the bonding head.

The increased complexity and reduction in size of integrated circuits has resulted in smaller areas available for bonding pads. As a result, wedge-wedge bonding is becoming more significant than the commonly used ball-wedge bonding.

Presently known bonding tools for wedge-wedge bonding include bonding tools which incorporate angle feeding of the wire under the foot of the bonding tool. While such angular wire feed may provide excellent results, small clearances near package walls posed impossible tasks for angled wire feed with normal forward wire bonding where the first bond is made to the integrated circuit chip and the second bond is made to the package. Reverse bonding (back bonding) has been suggested as a solution, but making second bonds on integrated circuit pads creates other problems. For example, the lay of the wire is lower near the second bond, thereby increasing the possibility of unwanted shorting contacts. Also, second bonds cannot be located as accurately as first bonds. Typically, the bonding areas on integrated circuits are smaller than the bonding areas on packaging elements.

Other presently known bonding tools include capillaries with vertical wire feed and would provide appropriate clearance at package walls. However, with such vertical wire feed bonding tools, wire control is difficult since the distance between the wire clamp and the bonding foot is typically quite substantial, on the order of several hundred times the wire diameter. Twists, kinks and bends may be readily formed between the wire clamp and the bonding tool foot.

SUMMARY OF THE INVENTION

It is therefore an object of the invention to provide an improved wire bonding tool and clamp assembly.

It is also an object of the invention to provide improved wire bonding tool and clamp assembly which incorporates vertical wire feeding.

Another object of the invention is to provide an an improved wire bonding tool and clamp assembly which achieves proper wire control and incorporates vertical wire feeding.

Still another object of the invention is to provide an improved wire bonding tool and clamp assembly which clears tight package wall clearances.

A further object of the invention is to provide an improved vertical feed wire bonding tool and clamp assembly wherein the clamp is closer to the bonding tool foot.

Still a further object of the invention is to provide a bonding tool and clamp assembly wherein the clamp assembly cooperates with the bonding tool to selectively clamp the bonding wire.

Also an object of the invention is to provide an improved bonding wire handling method which achieves a high degree of wire control and allows for bonding with tight package wall clearances.

The foregoing and other objects of the invention are accomplished in a wire bonding tool and clamp assembly which includes a bonding tool having a vertical guide hole adjacent the bonding foot. The bonding tool further includes a clamping surface above the vertical guide hole and vertically aligned with the guide hole. A clamp is mounted adjacent the clamping surface and selectively engaged against the clamping surface to clamp the bonding wire.

The wire handling method of the invention includes the steps of vertically feeding the bonding wire and selectively clamping the terminal portion of the bonding wire near the foot of the bonding tool.

BRIEF DESCRIPTION OF THE DRAWING

The advantages and features of the disclosed invention will be readily appreciated by persons skilled in the art from the following detailed description when read in conjunction with the drawing wherein:

FIG. 1 is a side elevational view showing a bonding head which includes the disclosed wire bonding tool and clamp assembly.

FIG. 2 is an exploded perspective view of the disclosed wire bonding clamp assembly.

FIG. 3 is a front elevational view of the bonding tool and clamp assembly of FIG. 2.

FIG. 4 is a sectional view of the disclosed bonding tool and clamp assembly taken along the section lines 4—4 in FIG. 3.

FIG. 5 is a sectional view of the disclosed bonding tool and clamp assembly taken along the section lines 5—5 in FIG. 4.

FIG. 6 is a detail partial sectional view of the tip of the bonding tool of the disclosed wire bonding tool and clamp assembly.

FIG. 7 is a side elevational view illustrating a further embodiment of the disclosed wire bonding tool and clamp assembly.

FIG. 8 shows the bonding tip of the disclosed bonding tool and clamp assembly in different positions as it is moved through a wire looping sequence.

FIG. 9 shows the bonding tip of the disclosed bonding tool and clamp assembly in different positions as it is moved through a wire pull-off sequence.

DETAILED DESCRIPTION OF THE INVENTION

In the following description and in the several figures of the drawing, like elements will be identified with like reference numerals.

For ease of understanding, the following description will include references to vertical orientation, such as vertical wire feed, in accordance with commonly used terms of art. Such references are relative to a horizontally oriented workpiece and will be readily appreciated as being directed to the concept of orientation substantially or close to perpendicular or normal to the workpiece.

Referring now to FIG. 1, generally shown therein is a bonding head 10 for a wire bonding machine. The bonding head 10 includes a bracket 11 which is coupled to apparatus (not shown) for moving the bonding head 10 to selected positions. Pivotally coupled to the bracket 11 is a transducer assembly which includes a transducer 13 (e.g., an ultrasonic transducer) which has a transducer arm 15. The bonding tool and clamp assembly of the invention includes a bonding tool 17 mounted at the end of the transducer arm 15 and a wire clamp assembly 20 mounted to the transducer assembly. The wire clamp assembly 20 is shown in the exploded perspective view of FIG. 2 and includes a support 19 which may be part of the transducer assembly. The clamp assembly 20 further includes a clamp blade 21 which includes a wider mounting and actuation portion 21a, which tapers to a flat narrow clamp 21b. The clamp blade 21 and an upper wire guide 23 are fastened to the support 19 by a pair of threaded fasteners 25 and 27.

An annular electromagnet assembly 29 is secured within the support 19. An armature 31 is secured to the clamp blade 21 by threaded fasteners 33 and 35 and is located beneath the electromagnet 29. A compression spring 37 is interposed between the armature 31 and the electromagnet 29, and tends to bias the armature 31 away from the support 19.

When the electromagnet assembly 29 is not energized, the spring bias on the armature 31 causes the clamp blade 21 to flex, thereby forcing the clamp 21b against a clamping surface of the bonding tool 17. In such clamped position, the bonding wire 39 is securely clamped between the bonding tool 17 and the clamp 21b. When the electromagnet 29 is energized, the armature 31 is magnetically attracted to the electromagnet 29 against the biasing force of the spring 37. This causes the clamp 21b to be released from the bonding tool 17. When the clamp 21 is thus released, wire feed can take place with appropriate movement of the bonding head 10 if the end of the wire 39 is bonded.

Referring to FIG. 6, shown therein is a cross-sectional detail view of the bonding tip 17a of the bonding tool 17. Specifically, the bonding tip 17a includes a bonding foot 41 which is the lowest portion of the bonding tip 17a. Formed in the bottom of the foot 41 is a small channel 43, which presses down on the wire 39 when the bonding foot 41 is forced against the workpiece.

The bonding tip 17a further includes a vertically aligned guide hole 45 which has its lower opening adjacent an arcuately shaped heel of the bonding foot 41. The arcuately shaped heel allows for a sharp and smooth bend of the wire 39. Above and vertically aligned with the guide hole 45 is a clamping surface 47 which is appropriately shaped to cooperate with the clamp 21b of the clamp blade 21. The clamping surface 47 is flat, hard and polished. It is contemplated that the bonding tip 17a include slightly raised sides on either side of the clamping surface which converge relative to each other towards the upper opening of the guide hole 45. Such raised sides facilitate the threading of the wire 39.

Instead of the raised sides converging toward the guide hole 45, the upper portion of the guide can be tapered or beveled in order to facilitate wire threading.

By way of example, it is contemplated that for bonding wire having a diameter of one-thousandth of an inch (one mil), the guide hole 45 would have a diameter about 1.4 mils, plus or minus 0.1 mils, and a minimum depth of about 5 mils.

In order to achieve proper wire control, the distance between the lower part of the clamp 21b and the heel of the bonding foot 41 should be small. For example, for 1 mil wire, the distance should be less than 100 mils and preferably should be 20 to 40 mils. Stated another way, the preferred distance is about 20 to 40 times the wire diameter.

Referring now to FIG. 7, shown therein is another embodiment of the disclosed wire bonding tool and clamp assembly. The clamping apparatus 30 includes a clamp blade 49 and an upper wire guide 51 which are fastened to a support 53 by a pair of fasteners (one of which is shown with the reference numeral 55) in a manner similar to the mounting of the clamp blade 21 and wire guide 23 in the clamp assembly 20. The clamp blade 49 is similar in shape to the clamp blade 21 (FIG. 2) and includes an upper mounting and actuation portion 49a and a clamp 49b. An annular electromagnet assembly 57 is fixedly attached to a bracket 59 which is mounted to the clamp blade 49 by a pair of fasteners (one of which is shown with the reference numeral 61) in a manner similar to the mounting of the armature 31 in the clamp assembly 20. The electromagnet assembly 57 surrounds a transducer arm 63 so as to allow for relative movement along the arm 63.

An adjustment screw 65 passes through the electromagnet bracket 59 and engages a threaded bore in the support 53. The head of the adjustment screw 65 limits the travel to the electromagnet bracket 59. A retaining clip 67 is engaged in the bracket 59 and in a slot 69 and tends to bias the bracket 59 against the head of the adjustment screw 65. The retaining clip 67 can be located in another slot 71 in the support bracket 53, and the retaining clip 67 in that position would bias the electromagnet support 59 toward the support bracket 53, and would provide additional clearance for wire threading.

A compression spring 73 is interposed between the clamp blade 49 and the electromagnet 57, and surrounds the transducer arm 63. A bonding tool 75 is mounted at the end of the transducer arm 63 adjacent the clamp 49b.

In operation, when the electromagnet assembly 57 is not energized, the spring 73 forces the clamp 49b against a clamping surface on the bonding tool 75. Such clamping surface is described above relative to the bonding tip 17a shown in FIG. 6. When the electromagnet assembly 57 is energized as shown in FIG. 7, the magnetic force on the clamp blade 49 overcomes the force of the spring 73 and the clamp is released from the clamping surface on the bonding tool 75. Thus, when the electromagnet assembly 57 is energized, the appropriate feeding of a bonding wire 77 can take place.

When the clamp 49b is released from the bonding tool 75 and the retaining clip 67 is in the slot 69, the distance between the clamp 49b and the clamping surface of the bonding tool 75 is controlled by the adjustment screw 65. The electromagnet bracket 59 can be moved further away from the bonding tool 75 by placing the clip 67 in the slot 71.

Referring now to FIG. 8, shown therein is a looping sequence of positions assumed by the bonding tip 17a as the bonding tool 17 moves from the first bond to the second bond. Specifically, position 1 shows the bonding tip 17a after it has completed the first bond. The clamp 21b is open so that wire can feed when the bonding tip 17a is raised vertically to position 2. The clamp 21b is then closed and the bonding tip 17a is directed to the location of the second bond, such movement being shown in positions 3 and 4. The second bond is made by vertically lowering the bonding tip 17a. While the sequence of FIG. 8 indicates vertical and horizontal displacement of the bonding tool, the looping sequence can be achieved by displacement of the workpiece in a horizontal plane and appropriate vertical displacement of the bonding head.

Referring now to FIG. 9, shown therein is a sequence of positions assumed by the bonding tip 17a as the bonding tool 17 accomplishes wire pull-off with the "table-pull" method. Position 1 indicates the making of the second bond with the bonding tip 17a being forced downwardly while the clamp 21b is open. After the second bond, with the clamp 21b open, the bonding tool is raised a few mils and is then moved over and down to about one and a half mils above the workpiece (position 3). The clamp 21b is then closed, and a horizontal move of about two or three mils in the direction of wire lay will break off the wire (position 4). After breakoff, the bonding tool is lifted (position 5) and positioned for the next first bond. While the sequence of FIG. 9 indicates vertical and horizontal displacement of the bonding tool, wire pull-off can be achieved by a common technique which utilizes horizontal displacement of the workpiece and vertical displacement of the bonding head.

In the foregoing described bonding tool and clamp assembly, the bonding tool is substantially perpendicular to the workpiece, and the wire feed is also substantially or close to perpendicular relative to the workpiece. Therefore, tight package clearances are readily handled while utilizing the preferred forward wire bonding technique wherein the first bond is to the integrated circuit chip. Also, since the bonding wire is clamped very close to the bonding foot, wire control is much more precise.

Although the foregoing has been a description of preferred embodiments of the invention, changes and modifications thereto can be made by persons skilled in the art without departing from the scope and spirit of the invention as defined by the following claims.

What is claimed is:

1. A bonding tool and clamp assembly for handling bonding wire relative to a workpiece, comprising:
   a bonding tool having a bonding foot with a heel;
   guiding means cooperating with said bonding tool for guiding the bonding wire substantially perpendicularly with respect to the workpiece; and
   clamping means cooperating with said bonding tool for selectively clamping the bonding wire against a clamping surface on said bonding tool near said bonding foot heel.

2. The bonding tool and clamp assembly of claim 1 wherein said guiding means includes an upper sire guide and wherein said bonding tool includes a short guide hole adjacent said bonding foot heel.

3. The bonding tool and clamp assembly of claim 2 wherein said bonding tool includes a clamping surface above said short guide hole, and wherein said clamping means includes a clamp which is selectively biased toward said clamping surface for clamping the bonding wire between said clamp and said clamping surface.

4. The bonding tool and clamp assembly of claim 3 wherein the bonding wire is clamped at a distance of less than 100 wire diameters from said bonding foot heel.

5. The bonding tool and clamp assembly of claim 4 wherein said clamping means further includes:
   biasing means for biasing said clamp toward said bonding tool clamping surface; and
   electromagnetic means for selectively counteracting said biasing means so that said clamp is withdrawn from said bonding tool clamping surface.

6. The bonding tool and clamp assembly of claim 5 wherein said clamping means further includes limiting means for limiting the displacement of said clamp from said bonding tool clamping surface.

7. A method for handling bonding wire comprising the steps of:
   guiding bonding wire substantially perpendicularly relative to a workpiece and along a clamping surface on a bonding tool having a foot with a heel; and
   selectively clamping the bonding wire against the clamping surface near the heel of the bonding tool foot.

8. The method for claim 7 wherein the step of guiding bonding wire includes the step of guiding the bonding wire adjacent the heel of the bonding tool foot.

9. The method of claim 7 wherein the step of selectively clamping the bonding wire includes the step of selectively clamping the bonding wire within 100 wire diameters of the heel of the bonding tool foot.

10. The method of claim 7 wherein said step of selectively clamping includes the step of selectively clamping the bonding wire against a surface on the bonding tool.

* * * * *